(12) United States Patent
Felder

(10) Patent No.: US 7,551,017 B2
(45) Date of Patent: Jun. 23, 2009

(54) LEVEL SHIFTER AND METHODS FOR USE THEREWITH

(75) Inventor: Matthew D. Felder, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 630 days.

(21) Appl. No.: 11/304,312

(22) Filed: Dec. 14, 2005

(65) Prior Publication Data
US 2007/0135156 A1    Jun. 14, 2007

(51) Int. Cl.
*H03L 5/00* (2006.01)
(52) U.S. Cl. .................................. 327/333; 327/562
(58) Field of Classification Search .............. 327/333, 327/538, 543, 561, 562, 563
See application file for complete search history.

(56) References Cited
U.S. PATENT DOCUMENTS

| | | | | |
|---|---|---|---|---|
| 6,005,439 A * | 12/1999 | Fong | ......................... | 330/253 |
| 6,433,624 B1 * | 8/2002 | Grossnickle et al. | ........ | 327/543 |
| 6,476,669 B2 * | 11/2002 | McClure et al. | ............. | 327/543 |
| 6,696,869 B1 * | 2/2004 | Tan | ............................. | 327/108 |
| 6,861,901 B2 * | 3/2005 | Prexl et al. | ................... | 329/347 |
| 7,068,093 B2 * | 6/2006 | Morishita et al. | ........... | 327/541 |
| 7,071,771 B2 * | 7/2006 | Takano et al. | ................ | 327/543 |
| 7,323,936 B2 * | 1/2008 | Dickman et al. | ............ | 330/261 |

* cited by examiner

*Primary Examiner*—Jeffrey S Zweizig
(74) *Attorney, Agent, or Firm*—Ingrassia, Fisher & Lorenz, PC

(57) ABSTRACT

A level shifter includes a first level shift module for producing a shifted signal by adjusting a direct current (DC) level of an input signal by a first bias voltage having a first polarity. A second level shift module produces an output signal by adjusting a DC level of the shifted signal by a second bias voltage having a second polarity. The first polarity is opposite to the second polarity and the sum of the first bias voltage and the second bias voltage is a non-zero voltage.

23 Claims, 10 Drawing Sheets

LEVEL SHIFTER AND METHODS FOR USE THEREWITH

CROSS REFERENCE TO RELATED PATENTS

None

TECHNICAL FIELD OF THE INVENTION

The present invention relates to level shifters used in devices such as radio receivers and system on a chip integrated circuits, and related methods.

DESCRIPTION OF RELATED ART

As is known, integrated circuits are used in a wide variety of electronic equipment, including portable, or handheld, devices. Such handheld devices include personal digital assistants (PDA), CD players, MP3 players, DVD players, AM/FM radio, pagers, cellular telephones, computer memory extensions (commonly referred to as a thumb drives), etc. Each of these handheld devices includes one or more integrated circuits to provide the functionality of the device.

As an example, a handheld FM radio receiver may include multiple integrated circuits to support the reception and processing of broadcast radio signals in order to produce an audio output that is delivered to the user through speakers, headphones or the like. Both analog and digital implementations are possible for many of the circuit components used to process these signals. It is often desirable to change the direct current (DC) bias of a signal that is processed to provide maximum rail to rail amplitude without clipping or other distortion, to provide accurate reference signals in circuits such as reference signal generators, comparators, analog to digital converters, digital to analog converters and in other circuits that are DC coupled or that otherwise process or respond to DC signals. When implemented in an integrated circuit, some level shifters use the threshold voltage or other device voltage of a metal oxide semiconductor field effect transistor (MOSFET), such as $V_{gs}$, as the fundamental unit of voltage shift. However, the physical characteristic of these devices severely limits the possible values of this voltage shift to the range of about 0.4-0.8 volts and multiples thereof.

The need exists for a level shifting circuit that can be implemented efficiently on an integrated circuit, and that can provide finer adjustments in the DC voltage.

DETAILED DESCRIPTION OF THE INVENTION INCLUDING THE PRESENTLY PREFERRED EMBODIMENTS

The embodiments of the present invention yield several advantages over the prior art. A level shifter provides finer and more accurate level shifting that can be easily implemented in, for instance, an integrated circuit implementation.

Figure 1:
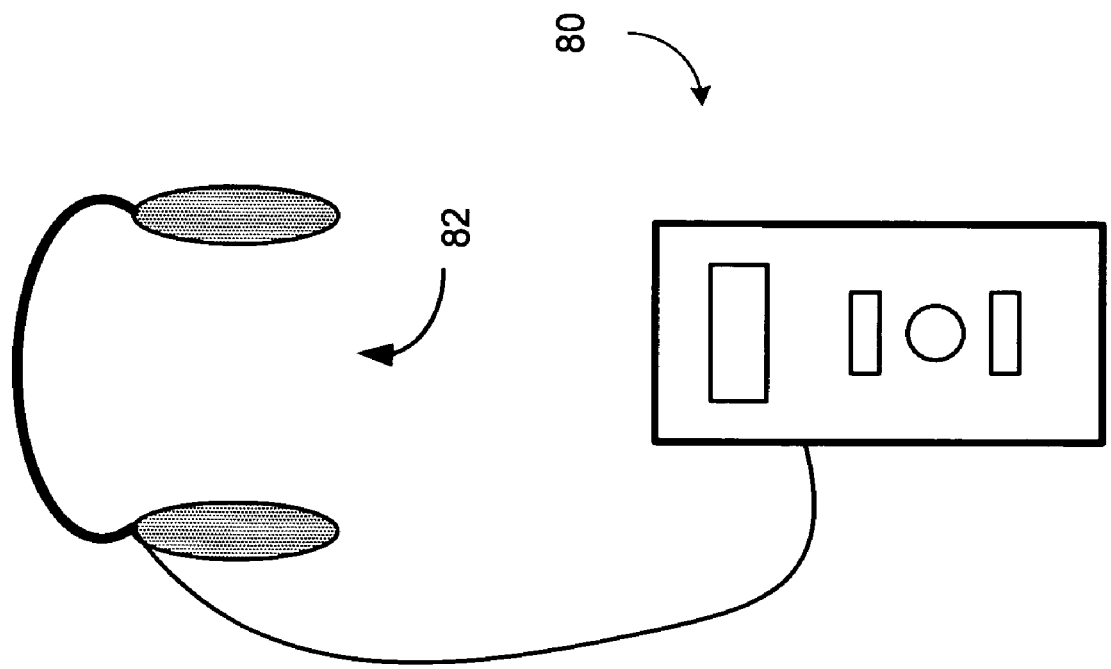
FIG. 1 presents a pictorial diagram representation of a handheld audio system in accordance with an embodiment of the present invention.

FIG. 1 presents a pictorial diagram of a handheld audio system in accordance with an embodiment of the present invention. In particular, a handheld audio system 80 is shown that receives a radio signal that carries at least one composite audio channel that includes right and left channel stereo audio signals. In an embodiment of the present invention, the radio signal includes one or more of a broadcast frequency modulated (FM) radio signal, an in-band on-channel (IBOC) digital radio signal, a Bluetooth signal, a broadcast amplitude modulated (AM) radio signal, a broadcast satellite radio signal, and a broadcast cable signal.

In operation, the handheld audio system 80 produces an audio output for a user by means of headphones 82 or other speaker systems. In addition to producing an audio output from the received radio signal, the handheld audio system 80 can optionally process stored MP3 files, stored WMA files, and/or other stored digital audio files to produce an audio output for the user. The handheld audio system may also include video features as well. Handheld audio system 80 includes a radio receiver and/or one or more integrated circuits (ICs) that implement the features and functions in accordance with one or more embodiments of the present invention that are discussed herein.

Figure 2:
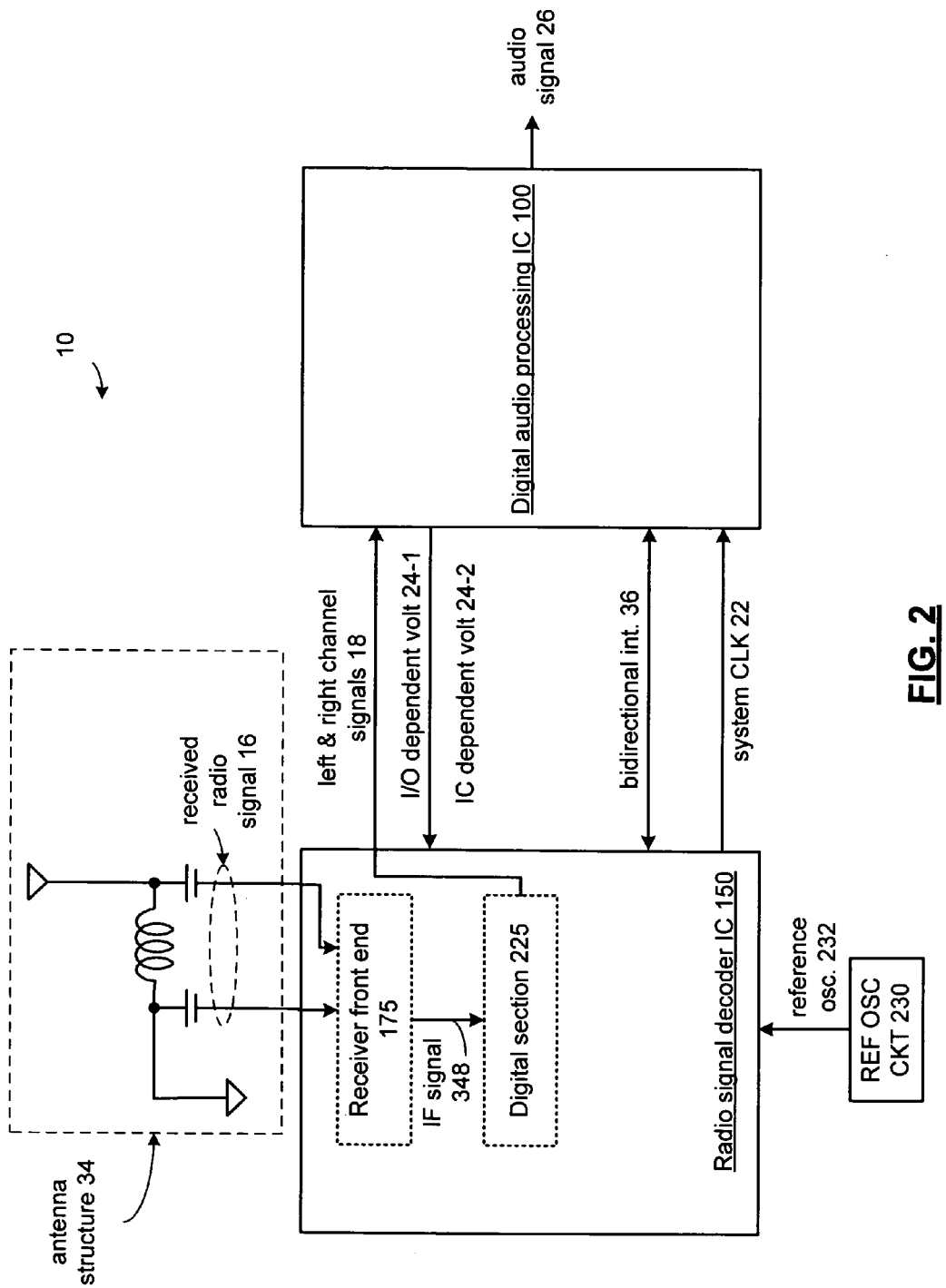
FIG. 2 presents a schematic block diagram representation of a radio receiver in accordance with an embodiment of the present invention.

FIG. 2 presents a schematic block diagram of a radio receiver in accordance with an embodiment of the present invention. In particular, radio receiver 10 is presented that includes a radio signal decoder integrated circuit 150 that includes a receiver front end 175, a level shifter and/or corresponding methods in accordance with FIGS. 3-12.

In this embodiment, the radio signal decoder integrated circuit 150 is operably coupled to a reference oscillator circuit 230 and an antenna structure 34. The reference oscillation circuit 230 is operably coupled to a crystal and produces therefrom a reference oscillation 232 and a system clock 22 that is provided to digital audio processing IC 100. The antenna structure 34 includes an antenna, a plurality of capacitors and an inductor coupled as shown. The received radio signal 16 is provided from the antenna structure 34 to the radio signal decoder integrated circuit 150. The receiver front end 175 converts the received radio signal 16 into an intermediate frequency (IF) signal 348 that is processed by digital section 225 to produce left and right channel signals

18. In an embodiment of the present invention, the received radio signal 16 is a broadcast frequency modulated radio signal, an IBOC digital radio signal, a Bluetooth radio signal, a broadcast amplitude modulated radio signal, a broadcast satellite radio signal or a broadcast cable signal.

The digital audio processing integrated circuit 100, via a DC-DC converter, generates an input/output (I/O) dependent supply voltage 24-1 and an integrated circuit (IC) dependent voltage 24-2 that are supplied to the radio signal decoder IC 150. In one embodiment, the I/O dependent voltage 24-1 is dependent on the supply voltage required for input/output interfacing of the radio signal decoder IC and/or the digital audio processing IC 14 (e.g., 3.3 volts) and the IC dependent voltage 24-2 is dependent on the IC process technology used to produce integrated circuits 150 and 100. The digital audio processing integrated circuit 100 further includes a processing module that may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a read-only memory, random access memory, volatile memory, non-volatile memory, static memory, dynamic memory, flash memory, cache memory, and/or any device that stores digital information. Note that when the processing module implements one or more of its functions via a state machine, analog circuitry, digital circuitry, and/or logic circuitry, the memory storing the corresponding operational instructions may be embedded within, or external to, the circuitry comprising the state machine, analog circuitry, digital circuitry, and/or logic circuitry. Further note that, the memory stores, and the processing module executes, operational instructions corresponding to at least some of the steps and/or functions illustrated in the Figures that follow.

The interface between the integrated circuits 150 and 100 further includes a bi-directional interface 36. Such an interface may be a serial interface for the integrated circuits 150 and 100 to exchange control data and/or other type of data. In one embodiment, the bi-directional interface 36 may be one or more serial communication paths that are in accordance with the I²C serial transmission protocol. As one of ordinary skill in the art will appreciate, other serial transmission protocols may be used for the bi-directional interface 36 and the bidirectional interface 36 may include one or more serial transmission paths.

In an embodiment of the present invention, radio signal decoder IC 150 is a system on a chip integrated circuit that operates as follows. Receiver front end 175 receives received radio signal 16 having a plurality of channel signals, each of the plurality of channel signals being modulated at one of a corresponding plurality of carrier frequencies. The receiver front end 175 converts the received radio signal 16 into an intermediate frequency (IF) signal 348 that is processed by digital section 225 to produce left and right channel signals 18.

In an embodiment of the present invention, the receiver front end 175 includes a level shifter for adjusting a DC level of an input signal to produce a shifted output signal. Further functions and features including advantages presented in various embodiments of the invention will be evident to one skilled in the art when presented the disclosure herein.

Figure 3:
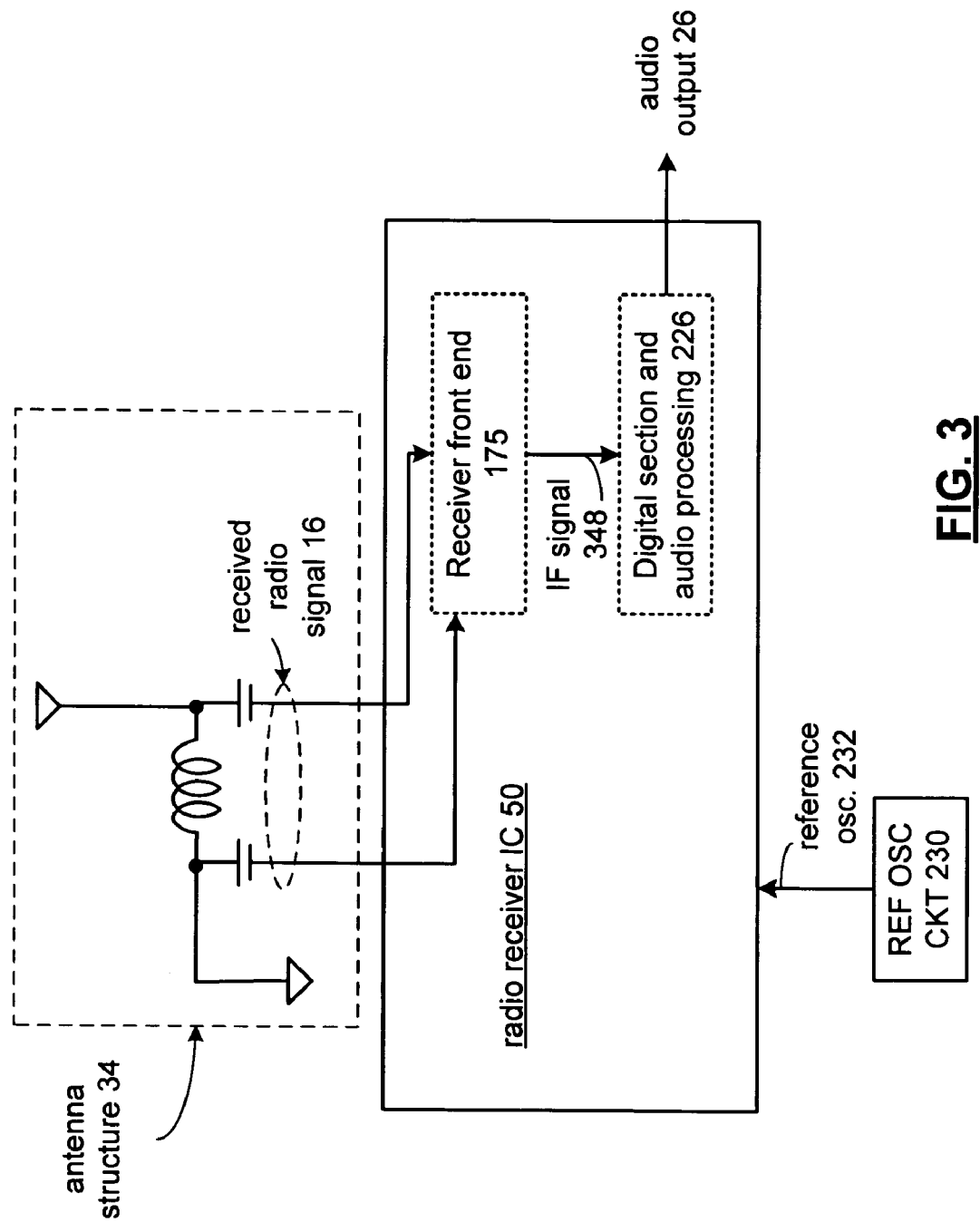
FIG. 3 presents a schematic block diagram representation of a radio receiver in accordance with an embodiment of the present invention.

FIG. 3 presents a schematic block diagram of a radio receiver in accordance with an alternative embodiment of the present invention. In particular, a schematic block diagram of a radio receiver is presented that includes the functionality of radio receiver 10 presented in an alternative system on a chip configuration. In this embodiment, the functionality of radio signal decoder IC 150 and digital audio processing IC 100 are incorporated into a single integrated circuit, radio receiver IC 50. In particular, radio receiver IC 50 includes receiver front end 175 as described in conjunction with FIG. 2. In addition, digital section and audio processing module 226 provide the functionality of digital section 225 and audio processing integrated circuit 100, absent the additional overhead required to provide an off-chip interface between radio receiver IC 150 and digital audio processing IC 100.

In addition to the configurations shown in FIG. 2 and FIG. 3, other configurations that include one or more integrated circuits are likewise possible. The broad scope of the present invention includes other partitioning of the various elements of the radio receiver of FIG. 2 into one or more integrated circuits.

Figure 4:
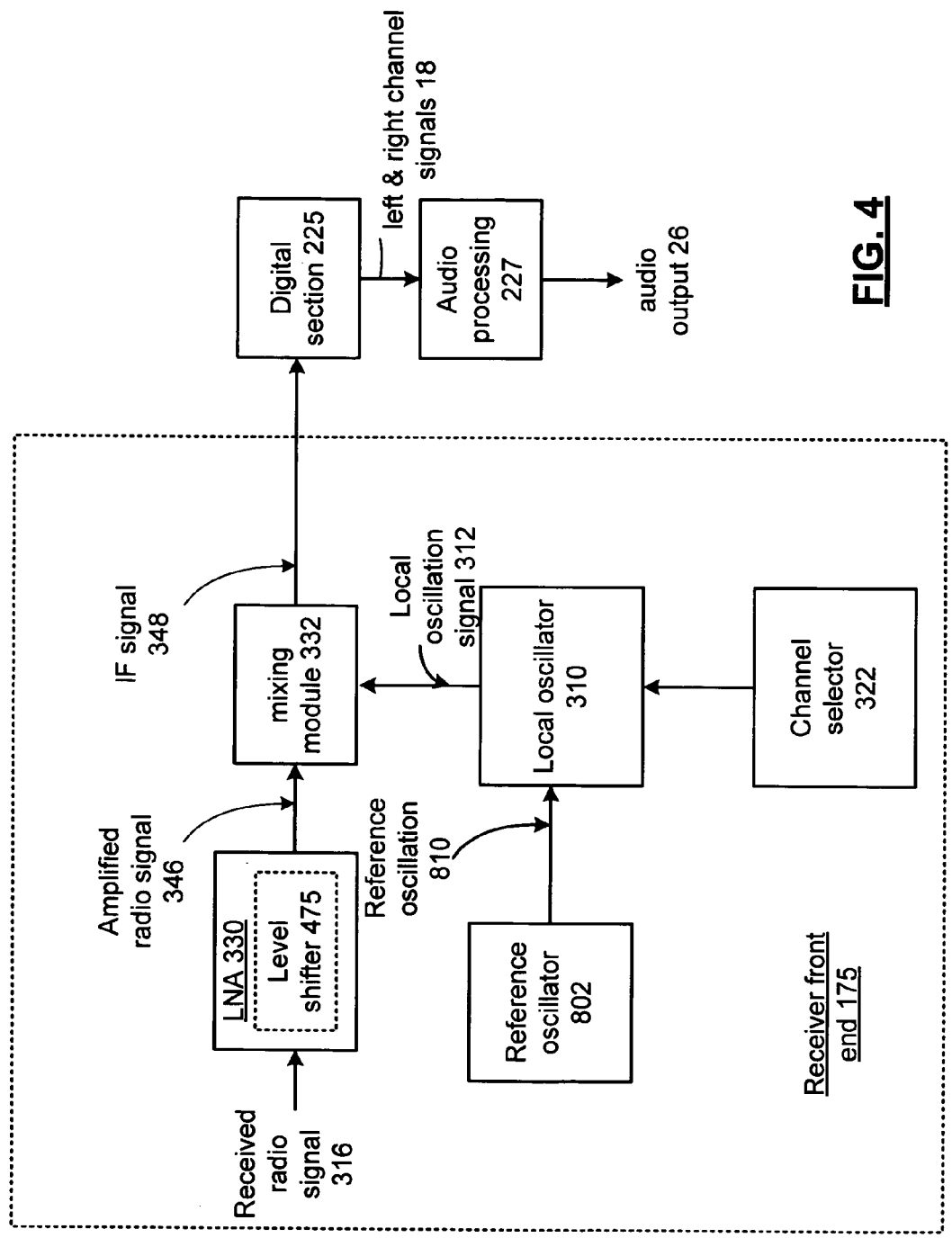
FIG. 4 presents a block diagram representation of a radio receiver front end in accordance with an embodiment of the present invention.

FIG. 4 presents a combination block diagram and schematic diagram of a receiver front end in accordance with an embodiment of the present invention. In particular, level shifter 475 in accordance with the present invention is included in a low noise amplifier 330. Radio receiver front end 175 receives a received radio signal 316, such as received radio signal 16, having a plurality of channel signals, each of the plurality of channel signals being modulated at one of a corresponding plurality of carrier frequencies. Reference oscillator 802 produces a reference oscillation 810 that is transformed by local oscillator 310 into a local oscillation signal 312 at a local oscillation frequency. A mixing module 322 produces a control signal that selects the local oscillation frequency for local oscillator 310 corresponding to a selection of one of the plurality of channels. In an embodiment of the present invention, local oscillator 310 includes a phase locked loop circuit for producing a selected local oscillation frequency based on the selected one of the plurality of channels.

Low noise amplifier 330 produces an amplified radio signal 346 that is mixed with the local oscillation signal 312 by mixing module 332 to form mixed signal 348 at an intermediate frequency. In a preferred embodiment of the present invention, the gain at which the low noise amplifier 330 amplifies the receive signal 316 is dependent on the magnitude of the received radio signal 316 and an automatic gain control circuit. Note that mixed signal 348 is a modulated signal and if the local oscillation signal 312 has a frequency that matches the frequency of the selected channel, the mixed signal 348 will have a carrier frequency of approximately zero. If the local oscillation 312 has a frequency that is not equal to the carrier frequency of radio signal 346, then the mixed signal 348 will have a carrier frequency based on the difference between the carrier frequency of the selected channel and the frequency of local oscillation 312. In such a situation, the carrier frequency of the mixed signal 348 may range from 0 hertz to one megahertz or more.

IF signal 348 is converted to a digital signal by an analog to digital converter module of digital section 225. Digital section demodulates the IF signal 348 and decodes and filters the selected channel signal to produce a demodulated signal, such as a stereo audio signal that includes left and right channel signals 18. Audio processing module 227, in turn, produces an audio output 26 to be supplied to one or more speakers, headphones or the like. Further functions and features of the level shifter 475 are discussed with greater particularity in conjunction with FIGS. 5-12 that follow.

Figure 5:
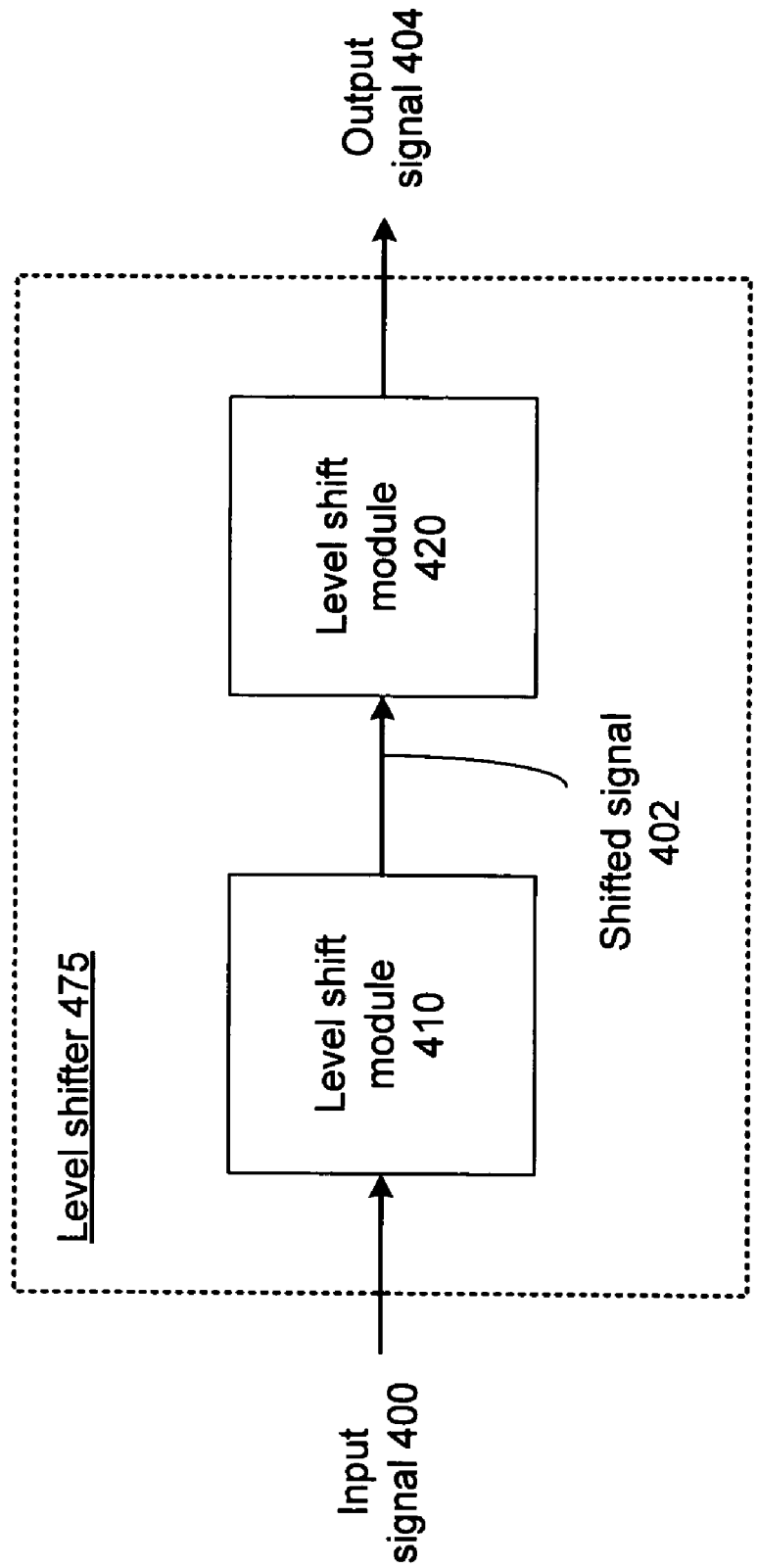
FIG. 5 presents a block diagram representation of a level shifter in accordance with an embodiment of the present invention.

FIG. 5 presents a block diagram representation of a level shifter in accordance with an embodiment of the present invention. A level shifter 475 is presented that includes a first level shift module 410 for producing a shifted signal 402 by adjusting a direct current (DC) level of an input signal 400 by a first bias voltage, $V_{b1}$, having a first polarity. A second level shift module 420 produces an output signal 404 by adjusting a DC level of the shifted signal 402 by a second bias voltage, $V_{b2}$, having a second polarity. In an embodiment of the present invention, the first polarity is opposite to the second polarity and further, the sum of the first bias voltage and the second bias voltage is a non-zero voltage, $\Delta$. Therefore, $V_{b1}+V_{b2}=\Delta$, where $\Delta \neq 0$ When considering the bias voltages have opposite polarities, the total shift in DC level between the input signal 400 and the output signal 404 is the difference between the magnitude of the first and second bias voltages. This allows a configuration whereby small level shifts can be accurately created by adding and then subtracting (or subtracting and then adding) DC levels of similar but unequal magnitudes. In an embodiment of the present invention, the fine adjustment in DC level is implemented because:

$|V_{b1}|+|V_{b2}|>|V_{b1}+V_{b2}|$

Figure 6:
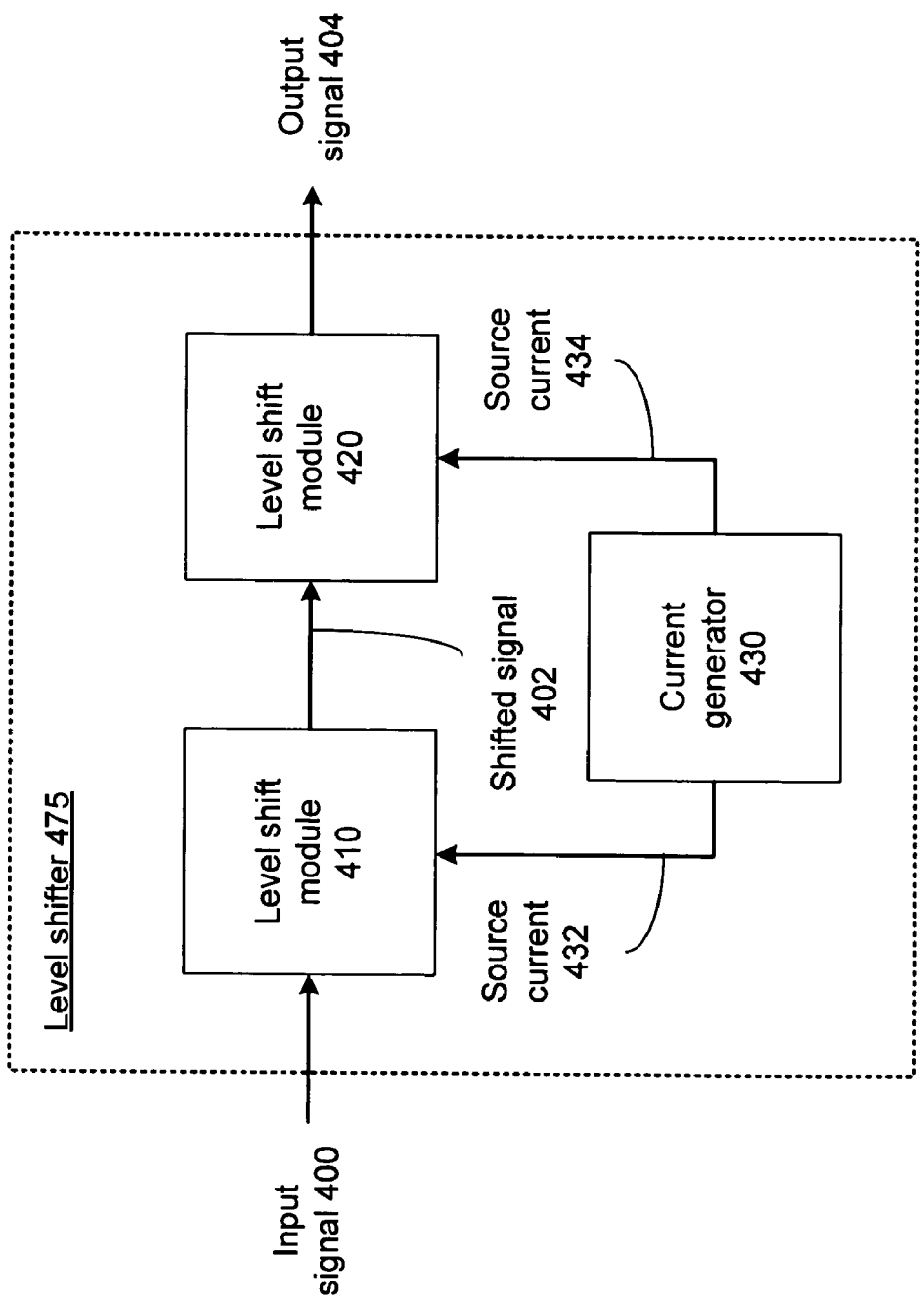
FIG. 6 presents a block diagram representation of a level shifter in accordance with an embodiment of the present invention.

FIG. 6 presents a block diagram representation of a level shifter in accordance with an embodiment of the present invention. In particular, an alternative embodiment of level shifter 475 is presented that includes level shift modules 410 and 420 presented in conjunction with FIG. 5. In this embodiment, current generator 430 is provided for generating a first source current 432 for the first level shift module 410 and for generating a second source current 434 for the second level shift module 420.

Accurately controlling the source currents 432 and 434 to the level shift modules 410 and 420 allows the difference between the magnitude of the first and second bias voltages to be accurately maintained, based on the particular devices used to implement level shift modules 410 and 420. In an embodiment of the present invention, devices with different device characteristics can be used to implement level shift modules 410 and 420, based on either equal or non-equal source currents 432 and 434. In an alternative embodiment, the difference between the magnitude of the first and second bias voltage can be accurately maintained by implementing level shift module 410 and 420 with similar devices, yet driving these devices with unequal source currents 432 and 434.

Figure 7:
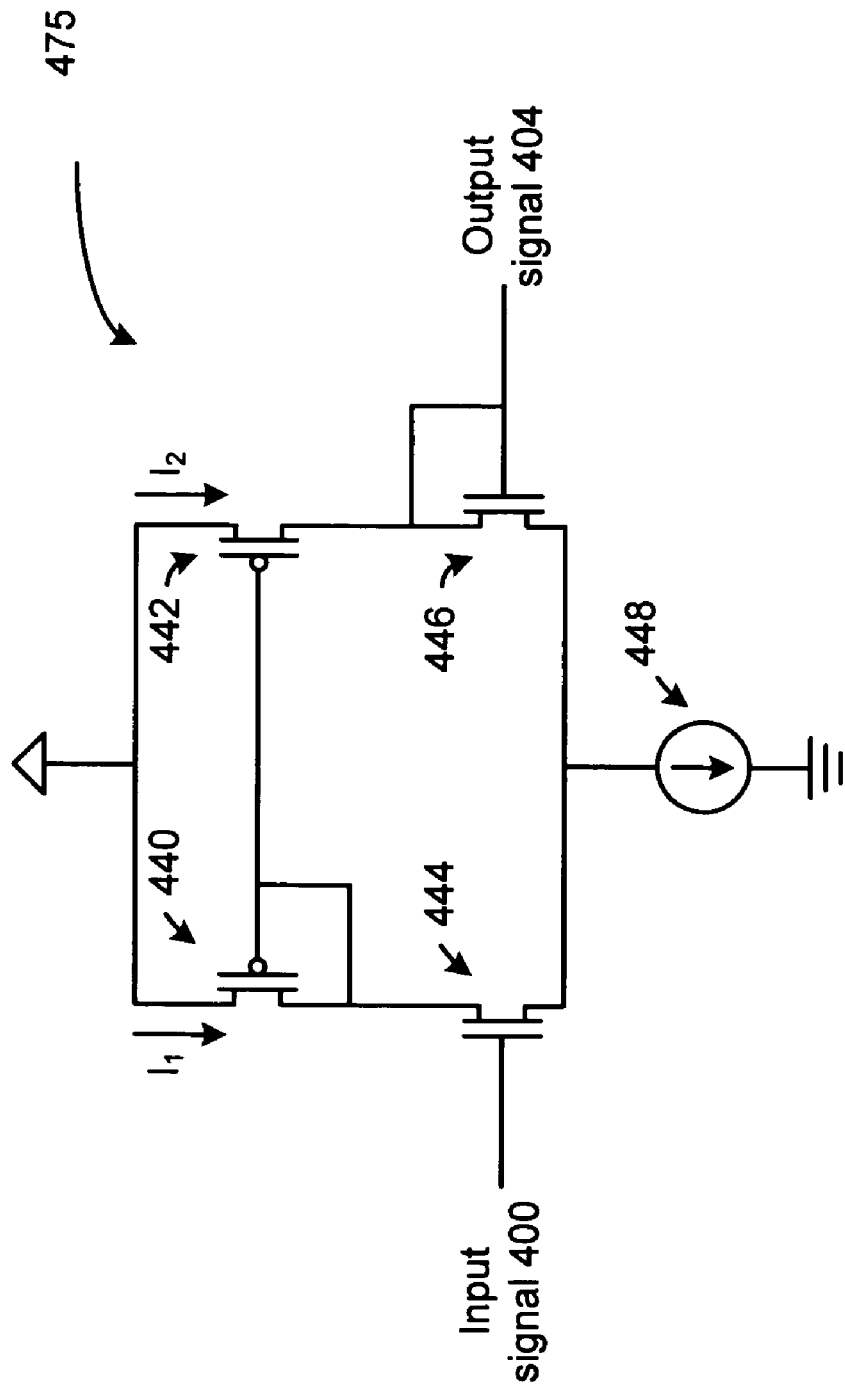
FIG. 7 presents a schematic diagram representation of a level shifter in accordance with an embodiment of the present invention.

FIG. 7 presents a schematic diagram representation of a level shifter in accordance with an embodiment of the present invention. A circuit implementation of level shifter 475 is presented that uses p-channel MOSFET (PMOS) transistors 440, 442 and current source 448 to implement current generator 430. Level shift modules 410 and 420 are implemented with n-channel MOSFET (NMOS) transistors 444 and 446 respectively.

In particular, PMOS transistors 440 and 442 are coupled in a current mirror configuration to produce source currents $I_1$ and $I_2$ to NMOS transistors 444 and 446. The operation of this circuit will be discussed in conjunction with three different embodiments as set forth below:

Embodiment #1—Similar PMOS transistors 440 and 442, different NMOS transistors 444 and 446.
Embodiment #2—Different PMOS transistors 440 and 442, similar NMOS transistors 444 and 446.
Embodiment #3—Different PMOS transistors 440 and 442, different NMOS transistors 444 and 446.

In a first embodiment in accordance with this particular circuit implementation of level shifter 475, PMOS transistors 440 and 442 are designed with similar device characteristics such as gate length, gate width and with an equal number of gate fingers such that the gate width to length ratios of these transistors are substantially equal or such that the operating characteristics of these transistors are otherwise substantially similar or matched. The current mirror circuit created by transistors 440 and 442 generates source currents $I_1$ and $I_2$ that are substantially equal and that are substantially independent from variations in supply voltage and temperature. In addition, $I=I_1+I_2$ Where I represents the current generated by current source 448.

On the other hand, NMOS transistors 444 and 446 are constructed with different device parameters such as gate width, gate length, gate width to length ratio (W/L), number of gate fingers, or other device characteristics. Representing the gate to source voltage of transistor 444 as $V_{gs1}$, and the gate to source voltage of transistor 446 as $V_{gs2}$, the threshold voltage of transistor 444 as $V_{t1}$, and he threshold voltage of transistor 446 as $V_{t2}$, and the gate width to length ratio of transistor 444 as M and the gate width to length ratio of transistor 446 as N, $V_{gs1}=(I_1/kM)^{1/2}+V_{t1}$ $V_{gs2}=(I_2/kN)^{1/2}+V_{t2}$ Assuming $I_1=I_2$, $V_{gs2}=(I_1/kN)^{1/2}+V_{t2}$ In operation, the bias voltages are produced by the gate to source voltages of transistors 444 and 446, $V_{b1}=-V_{gs1}$ $V_{b2}=V_{gs2}$ Representing the DC level of the input signal 400 as $V_i$ output signal 404 as $V_o$, $V_o=V_i+V_{b1}+V_{b2}$ $V_o=V_i+V_{gs2}-V_{gs1}$ or in terms of the total level shift, $\Delta=V_{gs2}-V_{gs1}$ Assuming that $V_{t1}=V_{t2}$, the desired level shift $\Delta$ can be designed based on:

$\Delta=(I_1/kN)^{1/2}-(I_1/kM)^{1/2}$

Where k is a proportionality constant that can be derived based on further device characteristics of transistors 444 and 446.

Turning our attention now to a second embodiment in accordance with this particular circuit implementation of level shifter 475, PMOS transistors 440 and 442 are designed with different device characteristics such as gate length, gate width and/or with an unequal number of gate fingers such that the gate width to length ratios of these transistors are not substantially equal or such that the operating characteristics of these transistors are otherwise substantially different or unmatched. The current mirror circuit created by transistors 440 and 442 generates source currents $I_1$ and $I_2$ that are not substantially equal, however, each source current is substantially constant and independent from variations in supply voltage and temperature. Representing the gate width to length ratio of transistor 440 as X and the gate width to length ratio of transistor 442 as Y, the source currents can be represented as:

$$I_1 = I(X/(X+Y))$$

$$I_2 = I(Y/(X+Y))$$

On the other hand, NMOS transistors 444 and 446 are constructed with similar device parameters such as gate width to length ratio, with an equal number of gate fingers. Representing the gate width to length ratio of transistors 444 and 446 as N, $$V_{gs1} = (I_1/kN)^{1/2} + V_{t1}$$

$$V_{gs2} = (I_2/kN)^{1/2} + V_{t2}$$

or $$V_{gs1} = (IX/kN(X+Y))^{1/2} + V_{t1}$$

$$V_{gs2} = (IY/kN(X+Y))^{1/2} + v_{t2}$$

As discussed in conjunction with the first embodiment, the bias voltages are produced by the gate to source voltages of transistors 444 and 446, $$V_{b1} = -V_{gs1}$$

$$V_{b2} = V_{gs2}$$

and $$V_o = V_i + V_{b1} + V_{b2}$$

$$V_o = V_i + V_{gs2} - V_{gs1}$$

$$\Delta = V_{gs2} - V_{gs1}$$

Assuming that $V_{t1} = V_{t2}$, the desired level shift $\Delta$ can be designed based on:

$$\Delta = (IY/kN(X+Y))^{1/2} - (IX/kN(X+Y))^{1/2}$$

Turning our attention now to a third embodiment in accordance with this particular circuit implementation of level shifter 475, as was the case in the second embodiment, PMOS transistors 440 and 442 are designed with different device parameters such as gate length, gate width and/or with an unequal number of gate fingers such that the gate width to length ratios of these transistors are not substantially equal or such that the operating characteristics of these transistors are otherwise substantially different or unmatched. The current mirror circuit created by transistors 440 and 442 generates source currents $I_1$ and $I_2$ that are not substantially equal, however, each source current is substantially constant and independent from variations in supply voltage and temperature. Representing the gate width to length ratio of transistor 440 as X and the gate width to length ratio of transistor 442 as Y, the source currents can be represented as:

$$I_1 = I(X/(X+Y))$$

$$I_2 = I(Y/(X+Y))$$

As was the case in the first embodiment, NMOS transistors 444 and 446 are constructed with different device parameters such as gate width to length ratio, with a different number of gate fingers. Representing the gate to source voltage of transistor 444 as $V_{gs1}$ and the gate to source voltage of transistor 446 as $V_{gs2}$, and the gate width to length ratio of transistor 444 as M and the gate width to length ratio of transistor 446 as N, $$V_{gs1} = (I_1/kM)^{1/2} + V_{t1}$$

$$V_{gs2} = (I_2/kN)^{1/2} + V_{t2}$$

or $$V_{gs1} = (IX/kM(X+Y))^{1/2} + V_{t1}$$

$$V_{gs2} = (IY/kN(X+Y))^{1/2} + V_{t2}$$

Assuming that $V_{t1} = V_{t2}$, the desired level shift $\Delta$ can be designed based on:

$$\Delta = (IY/kN(X+Y))^{1/2} - (IX/kM(X+Y))^{1/2}$$

Figure 8:
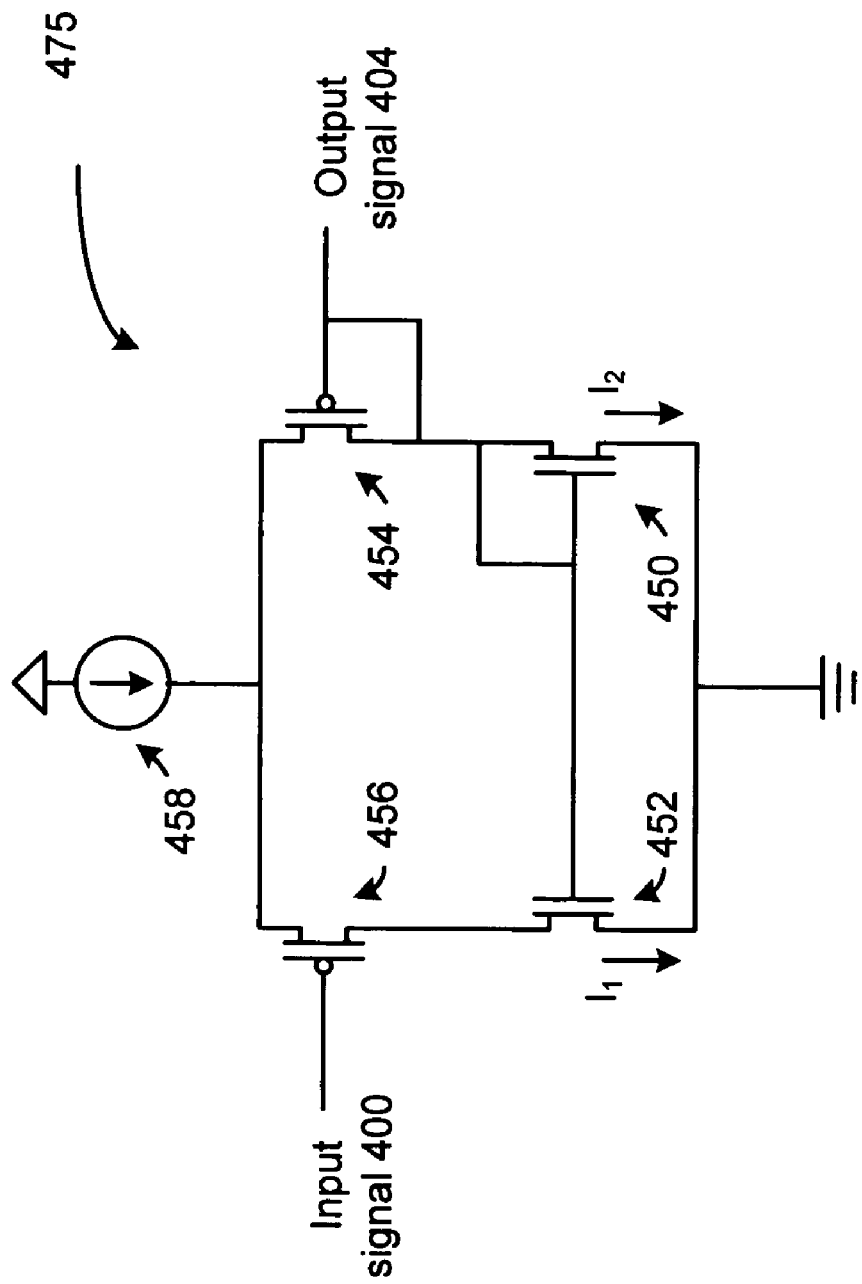
FIG. 8 presents a schematic diagram representation of a level shifter in accordance with an embodiment of the present invention.

FIG. 8 presents a schematic diagram representation of a level shifter in accordance with an embodiment of the present invention. In this embodiment, level shift modules 410 and 420 are implemented using PMOS transistors 454 and 456, and current generator 430 is implemented using NMOS transistors 450 and 452 that are coupled in a current mirror configuration. In this configuration, the bias voltages are produced by the gate to source voltage, $V_{gs2}$, of transistor 454 and by the gate to source voltage, $V_{gs1}$, of transistor 456 as follows:

$$V_{b1} = V_{gs1}$$

$$V_{b2} = -V_{gs2}$$

Similar to the discussion of FIG. 7, three embodiments will be discussed. Using the variables of transistors 444 and 446 to represent, respectively, transistors 456 and 454, and further the variables of transistors 440 and 442 to represent, respectively, transistors 452 and 450, the level shifts can similarly be represented as Fourth embodiment:

$$\Delta = ((I_1/kM)^{1/2} - (I_1/kN)^{1/2})$$

Fifth embodiment:

$$\Delta = ((IX/kN(X+Y))^{1/2} - (IY/kN(X+Y))^{1/2})$$

Sixth embodiment:

$$\Delta = ((IX/kM(X+Y))^{1/2} - (IY/kN(X+Y))^{1/2})$$

Each of the embodiments presented in conjunction with FIGS. 7-8 can be used to implement fine shifts in the DC level of an input signal. The value of $\Delta$ can be designed to provide a level shift in the range of several hundred milli-volts down to tens of milli-volts or smaller, depending on the particular devices chosen, their device characteristics and the fabrication technologies used to implement these devices.

In preferred embodiments, the various circuit components are implemented using 0.35 micron or smaller CMOS technology. Provided however that other circuit technologies, both integrated or non-integrated, may be used within the broad scope of the present invention. While the various embodiments presented in conjunction with FIGS. 7 and 8 use MOSFET transistors, other devices including other transistor technologies, such as junction field effect transistors, bipolar junction transistors, metal-semiconductor field effect transistors, high electron mobility transistors, thin film transistors and others can likewise be employed.

While the embodiments presented in conjunction with FIGS. 7-8 illustrate level shifts based on substantially similar or substantially different gate width to length ratios, other device parameters may be likewise used within the broad scope of the present invention.

Figure 10:
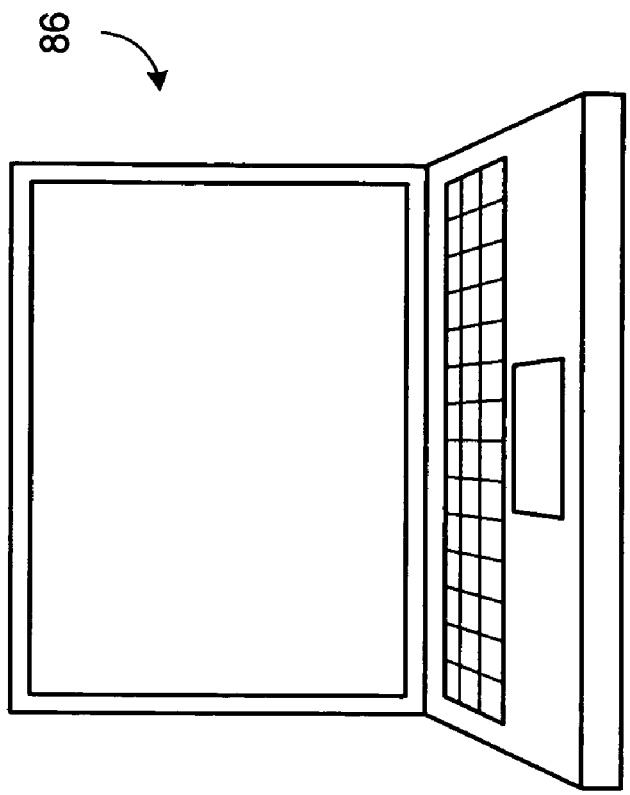
FIG. 9-10 present pictorial diagram representations of various devices in accordance with an embodiment of the present invention.
Figure 9:
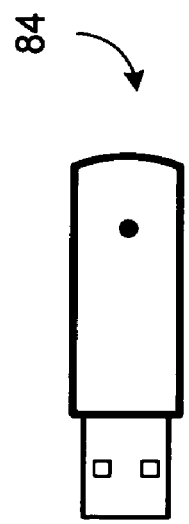

FIGS. 9-10 present pictorial diagram representations of various devices in accordance with an embodiment of the present invention. While the preceding disclosure has been directed to a level shifter 475 used in conjunction with a handheld audio system (e.g., system 80, FIG.1), a receiver (e.g., the receivers illustrated in FIGS. 2 and 3), and/or a low noise amplifier 330, in an embodiment of the present invention, level shifter 475 may be implemented by itself or as part of other integrated circuits including a system on a chip integrated circuit. While implemented as part of an integrated circuit or as part of a system on a chip integrated circuit, level shifter 475 can be used in a wide variety of electronic devices such as universal serial bus (USB) device 84, in computer 86, or in a variety of other electronic devices that change the direct current (DC) bias of a signal that is processed to provide maximum rail to rail amplitude without clipping or other distortion, that provide accurate reference signals in circuits such as reference signal generators, comparators, analog to digital converters, digital to analog converts and in other circuits that are DC coupled or that otherwise process or respond to DC signals.

Figure 11:
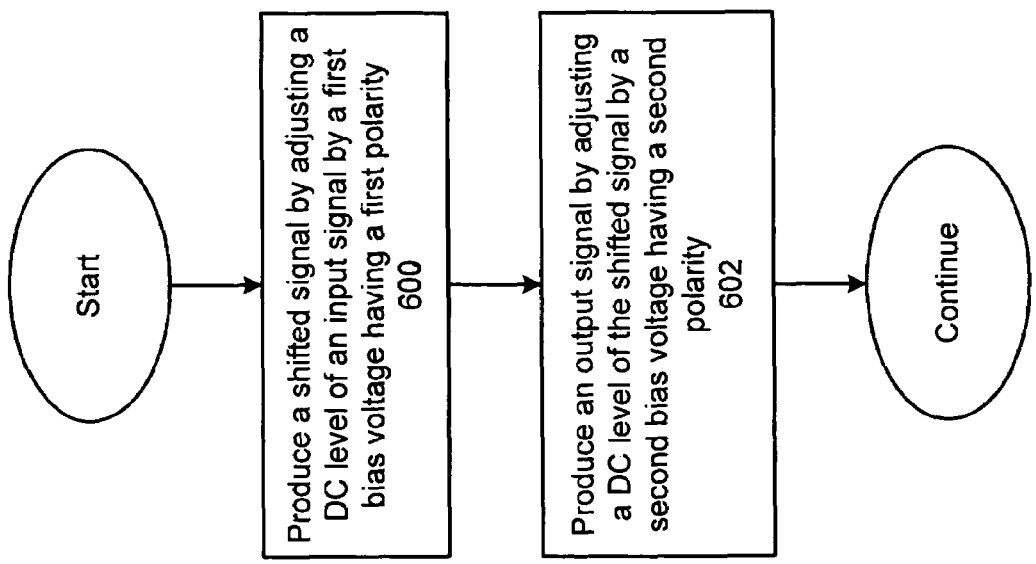
FIG. 11 presents a flowchart representation of a method in accordance with an embodiment of the present invention.

FIG. 11 presents a flowchart representation of a method in accordance with an embodiment of the present invention. In particular, a method is presented for use with one or more of the features and functions discussed in conjunction with the embodiments of FIGS. 1-10. The method includes step 600 for producing a shifted signal by adjusting a direct current (DC) level of an input signal by a first bias voltage having a first polarity. In step 602, an output signal is produced by adjusting a DC level of the shifted signal by a second bias voltage having a second polarity, wherein the first polarity is opposite to the second polarity and wherein the sum of the first bias voltage and the second bias voltage is a non-zero voltage.

In an embodiment of the present invention, the first bias voltage $V_{b1}$ and the second bias voltage $V_{b2}$ are related by the following inequality:

$$|V_{b1}|+|V_{b2}|>|V_{b1}+V_{b2}|$$

Figure 12:
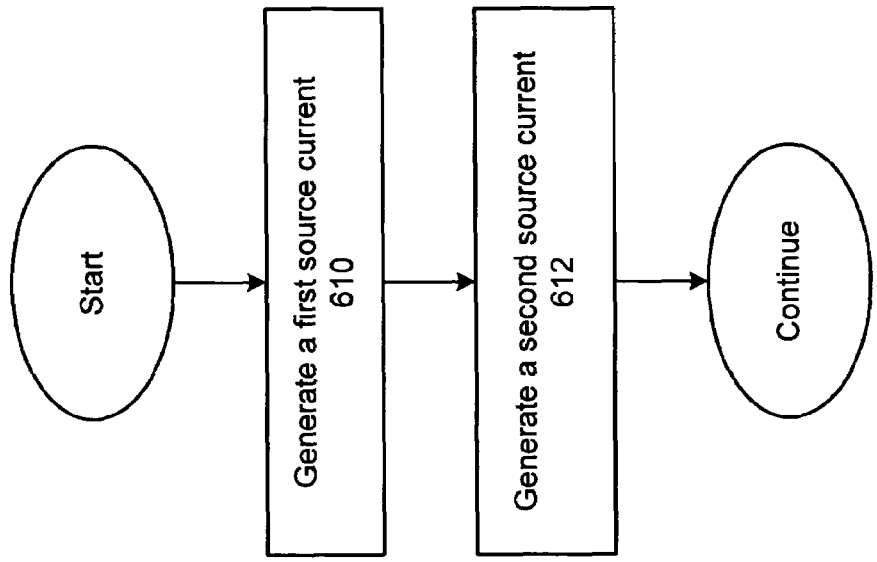
FIG. 12 presents a flowchart representation of a method in accordance with an embodiment of the present invention.

FIG. 12 presents a flowchart representation of a method in accordance with an embodiment of the present invention. A method is presented for use with one or more of the features and functions discussed in conjunction with the embodiments of FIGS. 1-11. In particular, steps are included for use in implementing steps 600 and 602 of FIG. 11. In step 610 a first source current is generated such that step 600 includes producing the first shifted voltage based on the first source current. In step 612, a second source current is generated, such that step 602 includes producing the second shifted voltage based on the second source current. In alternate embodiments of the present invention, the first and second source currents can be equal or not equal.

Various elements and modules embodiments described herein can also be implemented as software programs running on a computer processor. It should also be noted that the software implementations of the present invention can be stored on a tangible storage medium such as a magnetic or optical disk, read-only memory or random access memory and also be produced as an article of manufacture.

As one of ordinary skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of ordinary skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operably coupled". As one of ordinary skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As the term circuit module is used in the description of the various embodiments of the present invention, a circuit module includes a functional block that is implemented in hardware, software, and/or firmware that performs one or module functions including the processing of an input signal to produce an output signal. As used herein, a circuit module may contain submodules that themselves are circuit modules.

Thus, there has been described herein an apparatus and method, as well as several embodiments including a preferred embodiment, for implementing a level shifter, receiver front end and system on a chip integrated circuit. Various embodiments of the present invention herein-described have features that distinguish the present invention from the prior art.

It will be apparent to those skilled in the art that the disclosed invention may be modified in numerous ways and may assume many embodiments other than the preferred forms specifically set out and described above. Accordingly, it is intended by the appended claims to cover all modifications of the invention which fall within the true spirit and scope of the invention.

What is claimed is:

1. A level shifter comprising:
a current generator for generating a first source current and a second source current, wherein the current generator includes
a current source,
a first current mirror field effect transistor (FET) adapted to produce the first source current, and having a drain, a gate, and a source coupled to a first potential, and
a second current mirror FET adapted to produce the second source current, and having a drain, a source coupled to the first potential, and a gate coupled to the gate of the first current mirror FET and to the drain of the first current mirror FET, wherein the first current mirror FET and the second current mirror FET have different numbers of gate fingers so that the first source current and the second source current are unequal;
a first level shift module adapted to produce a shifted signal by adjusting a direct current (DC) level of an input signal by a first bias voltage having a first polarity, wherein the first bias voltage is generated based on the first source current, and the first level shift module includes a first level shift FET having a gate coupled to receive the input signal, a source coupled to the current source, and a drain coupled to the drain of the first current mirror FET, to the gate of the first current mirror FET, and to the gate of the second current mirror FET; and a second level shift module adapted to produce an output signal by adjusting a DC level of the shifted signal by a second bias voltage having a second polarity, wherein the second level shift module includes a second level shift FET having a source coupled to the current source, a drain coupled to the drain of the second current mirror FET, and a gate coupled to the drain of the second current mirror FET, and wherein the second bias voltage is generated based on the second source current, and wherein the first polarity is opposite to the second polarity, and wherein a sum of a magnitude of the first bias voltage and a magnitude of the second bias voltage is a non-zero voltage that corresponds to a total shift in DC level between the input signal and the output signal.

2. The level shifter of claim 1 wherein the first source current is at least twenty percent different from the second source current.

3. The level shifter of claim 1 wherein the first current mirror FET has a first gate width to length ratio and the second current mirror FET has a second gate width to length ratio, wherein the first gate width to length ratio is substantially equal to the second gate width to length ratio.

4. The level shifter of claim 1 wherein the a first current mirror FET has a first current mirror transistor parameter and the second current mirror FET has a second current mirror transistor parameter, wherein the first current mirror transistor parameter is not substantially equal to the second current mirror transistor parameter.

5. The level shifter of claim 4 wherein first current mirror transistor parameter and the second current mirror transistor parameter are gate width to length ratios.

6. The level shifter of claim 1 wherein the first level shift FET has a first gate width to length ratio and the second level shift FET has second gate width to length ratio, wherein the first gate width to length ratio is substantially equal to the second gate width to length ratio.

7. The level shifter of claim 1 wherein the first level shift FET has a first level shift transistor parameter and the second level shift FET has a second level shift transistor parameter, wherein the first level shift transistor parameter is not substantially equal to the second level shift transistor parameter.

8. The level shifter of claim 7 wherein first level shift transistor parameter and the second level shift transistor parameter are gate width to length ratios.

9. The level shifter of claim 1 wherein the first bias voltage $V_{b1}$ and the second bias voltage $V_{b2}$ are related by the following inequality:

$$|V_{b1}|+|V_{b2}|>|V_{b1}+V_{b2}|.$$

10. The level shifter of claim 1 wherein the first level shift module and the second level shift module are implemented in a system on a chip integrated circuit.

11. A level shifter comprising:

a current generator for generating a first source current and a second source current, wherein the first source current is at least twenty percent different from the second source current;

a first level shift module for producing a shifted signal by adjusting a direct current (DC) level of an input signal by a first bias voltage having a first polarity, wherein the first bias voltage is generated based on the first source current, wherein the first level shift module includes a first level shift FET having a first level shift gate coupled to the input signal, and having a first level shift drain and a first level shift source; and a second level shift module for producing an output signal by adjusting a DC level of the shifted signal by a second bias voltage having a second polarity, wherein the first polarity is opposite to the second polarity, wherein the sum of the first bias voltage and the second bias voltage is a non-zero voltage, wherein the second bias voltage is generated based on the second source current, and wherein the second level shift modules includes a second level shift FET having a second level shift gate coupled to a second level shift drain for producing the output signal, and having a second level shift source coupled to the first level shift source, wherein the current generator includes:

a current source coupled to the first level shift source and the second level shift source;

a first current mirror field effect transistor (FET), having a first current mirror source coupled to a supply voltage, and having a first current mirror drain coupled and a first current mirror gate coupled to the first level shift drain; and a second current mirror FET having a second current mirror source coupled to the supply voltage, a second current mirror gate coupled to the first current mirror gate, the first current mirror drain and the first level shift drain, and having a second current mirror drain coupled to the second level shift drain and the second level shift gate, wherein the first current mirror FET and the second current mirror FET have a first metal oxide semiconductor (MOS) type, and the first level shift FET and the second level shift FET have a complimentary MOS type.

12. A level shifter comprising:

a first level shift module for producing a shifted signal by adjusting a direct current (DC) level of an input signal by a first bias voltage having a first polarity;

a second level shift module for producing an output signal by adjusting a DC level of the shifted signal by a second bias voltage having a second polarity, wherein the second level shift module includes a second transistor, and wherein the first polarity is opposite to the second polarity, and wherein the sum of the first bias voltage and the second bias voltage is a non-zero voltage; and a current generator for providing a first source current to the first level shift module and providing a second source current to the second level shift module, wherein the current generator includes a current mirror for producing the first source current and the second source current and a current source coupled to first transistor and to the second transistor, and wherein the first source current is at least twenty percent different from the second source current.

13. The level shifter of claim 12 wherein the current mirror includes a first current mirror transistor having a first gate width to length ratio and a second current mirror transistor having a second gate width to length ratio, wherein the first gate width to length ratio is substantially equal to the second gate width to length ratio.

14. The level shifter of claim 12 wherein the current mirror includes a first current mirror transistor having a first current mirror transistor parameter and a second current mirror transistor having a second current mirror transistor parameter, wherein the first current mirror transistor parameter is not substantially equal to the second current mirror transistor parameter.

15. The level shifter of claim 14 wherein first current mirror transistor parameter and the second current mirror transistor parameter are gate width to length ratios.

16. The level shifter of claim 12 wherein the first level shift FET has a first gate width to length ratio and the second level shift FET has a second gate width to length ratio, wherein the first gate width to length ratio is substantially equal to the second gate width to length ratio.

17. The level shifter of claim 12 wherein the first level shift FET has a first level shift transistor parameter and the second level shift FET has a second level shift transistor parameter, wherein the first level shift transistor parameter is not substantially equal to the second level shift transistor parameter.

18. The level shifter of claim 17 wherein first level shift transistor parameter and the second level shift transistor parameter are gate width to length ratios.

19. The level shifter of claim 12 wherein the first bias voltage $V_{b1}$ and the second bias voltage $V_{b2}$ are related by the following inequality:

$$|V_{b1}|+|V_{b2}|>|V_{b1}+V_{b2}|.$$

20. The level shifter of claim 12 wherein the first level shift module and the second level shift module are implemented in a system on a chip integrated circuit.

21. A level shifter comprising:
a first level shift module for producing a shifted signal by adjusting a direct current (DC) level of an input signal by a first bias voltage having a first polarity, wherein the first level shift module includes a first level shift FET having a first level shift gate coupled to the input signal, and having a first level shift drain and a first level shift source;
a second level shift module for producing an output signal by adjusting a DC level of the shifted signal by a second bias voltage having a second polarity, wherein the first polarity is opposite to the second polarity, wherein the sum of the first bias voltage and the second bias voltage is a non-zero voltage, and wherein the second level shift module includes a second level shift FET having a second level shift gate coupled to a second level shift drain for producing the output signal, and having a second level shift source coupled to the first level shift source; and
a current generator for providing a first source current to the first level shift module and providing a second source current to the second level shift module, wherein the first source current is at least twenty percent different from the second source current, and wherein the current generator includes:
a current source coupled to the first level shift source and the second level shift source;
a first current mirror field effect transistor (FET), having a first current mirror source coupled to a supply voltage, and having a first current mirror drain coupled and a first current mirror gate coupled to the first level shift drain;
a second current mirror FET having a second current mirror source coupled to the supply voltage, a second current mirror gate coupled to the first current mirror gate, the first current mirror drain and the first level shift drain, and having a second current mirror drain coupled to the second level shift drain and the second level shift gate;
wherein the first current mirror FET and the second current mirror FET have a first metal oxide semiconductor (MOS) device type, and the first level shift FET and the second level shift FET have a complimentary MOS device type.

22. A method comprising:
generating a first source current by a current generator circuit that includes a current source and current mirror;
generating a second source current genterator circuit, wherein the first source current is at least twenty percent different from the source current;
producing a shifted signal by adjusting a direct current (DC) level of an input signal by a first bias voltage having a first polarity;
producing an output signal by adjusting a DC level of the shifted signal by a second bias voltage having a second polarity;
wherein the first polarity is opposite to the second polarity and wherein the sum of the first bias voltage and the second bias voltage is a non-zero voltage.

23. The receiver front end of claim 22 wherein the first bias voltage $V_{b1}$ and the second bias voltage $V_{b2}$ are related by the following inequality:

$$|V_{b1}|+|V_{b2}|>|V_{b1}+V_{b2}|.$$

* * * * *